United States Patent
Huang

(10) Patent No.: US 9,653,325 B2
(45) Date of Patent: May 16, 2017

(54) UNDERFILL PROCESS AND PROCESSING MACHINE THEREOF

(71) Applicant: Powertech Technology Inc., Hsinchu County (TW)

(72) Inventor: Hung-Chieh Huang, Hsinchu County (TW)

(73) Assignee: Powertech Technology Inc., Hsinchu County (TW)

(*) Notice: Subject to any disclaimer, the term of this patent is extended or adjusted under 35 U.S.C. 154(b) by 0 days.

(21) Appl. No.: 14/623,509

(22) Filed: Feb. 17, 2015

(65) Prior Publication Data

US 2016/0240393 A1 Aug. 18, 2016

(51) Int. Cl.
*H01L 21/56* (2006.01)
*H01L 21/66* (2006.01)
*H01L 23/00* (2006.01)

(52) U.S. Cl.
CPC ............ *H01L 21/563* (2013.01); *H01L 22/12* (2013.01); *H01L 24/75* (2013.01); *H01L 21/561* (2013.01); *H01L 24/16* (2013.01); *H01L 24/32* (2013.01); *H01L 24/73* (2013.01); *H01L 24/92* (2013.01); *H01L 2224/16227* (2013.01); *H01L 2224/32225* (2013.01); *H01L 2224/73204* (2013.01); *H01L 2224/92125* (2013.01)

(58) Field of Classification Search
CPC ...... H01L 21/563; H01L 21/561; H01L 21/22
See application file for complete search history.

(56) References Cited

U.S. PATENT DOCUMENTS

| 5,906,682 | A | * | 5/1999 | Bouras | ................ | B05C 11/101 |
| | | | | | | 118/323 |
| 7,256,833 | B2 | * | 8/2007 | Shaw | .................. | H04N 5/2354 |
| | | | | | | 118/713 |
| 7,607,554 | B2 | * | 10/2009 | Hynes | ................. | F04B 43/1223 |
| | | | | | | 222/101 |
| 8,703,601 | B2 | * | 4/2014 | Ikushima | .............. | H01L 21/563 |
| | | | | | | 264/263 |
| 2004/0148763 | A1 | * | 8/2004 | Peacock, Jr. | ........ | H05K 13/0069 |
| | | | | | | 29/739 |
| 2013/0337616 | A1 | * | 12/2013 | Kim | ........................ | H01L 21/56 |
| | | | | | | 438/127 |

* cited by examiner

*Primary Examiner* — Robert B Davis
(74) *Attorney, Agent, or Firm* — Jianq Chyun IP Office

(57) ABSTRACT

A processing machine of an underfill process comprises a carrier, an automated device, a scanning mechanism, an identifying device and a host. The carrier is suitable for carrying a package substrate provided with chips bonded thereon. The automated device has a dispenser for filling an underfill between each chip and the package substrate. The scanning mechanism is configured on the carrier, and the identifying device is driven by the scanning mechanism to move along a predetermined path over the package substrate and identify positions of the chips before the dispenser fills the underfill between each chip and the package substrate. The identifying device is suitable for outputting an identifying result of chip position, and a movement of the identifying device is independent from a movement of the dispenser. The host receives the identifying result and locates the dispenser of the automated device according to the identifying result.

17 Claims, 3 Drawing Sheets

UNDERFILL PROCESS AND PROCESSING MACHINE THEREOF

BACKGROUND OF THE INVENTION

1. Field of the Invention

The present invention generally relates to a processing machine, in particular, to a processing machine of underfill process.

2. Description of Related Art

Along with an increasing and increasing IC (integrated circuit) integrity, diverse chip packaging technologies emerge. In particular, a so-called flip-chip interconnect technology (FC interconnecting) has the most advantage due to a downsized chip package and a shortened signal transmission path thereof and is widely applied in chip packaging field today. Such as chip scale package (CSP), direct chip attached package (DCA package) and multi-chip module package (MCM package), most of the chip packaging can be done by means of flip-chip interconnect technology (FC interconnecting).

Basically, a flip-chip interconnect technology (FC interconnecting) can be described as follows. Bonding pads in array are disposed on an active surface of a chip and then bumps are formed on the bonding pads. Afterwards, the chip is flipped and the bumps on the chip are placed such way to interconnect the same to a plurality of bump pads on a substrate, so that the chip and the substrate are able to mechanically and electrically interconnect to each other and the chip can further be electrically connected to an external electronic device through the internal circuits in the substrate. In addition, since thermal stress between the chip and the substrate could be happened due to unmatched coefficients of thermal expansion (CTE) thereof, an underfill is preferably filled between the chip and the substrate. The underfill encapsulates the bumps to avoid crack caused by a repeatedly action of thermal stress between the chip and the substrate.

In general, the above mentioned process is performed in an array-type, wherein plural chips are bonded on an array-type substrate, and the underfill is then filled between each of the chips and the substrate in sequence by an underfill dispenser. However, it takes a lot of time to locate the underfill dispenser for each of the chips by identifying location patterns on the substrate, and the processing efficiency is low. Furthermore, the location patterns are identified by a camera assembled on the dispenser; however, the position of the camera in relative to the dispenser is likely to vary during the underfill process, such that the identifying results become incorrect, and abnormal dispensing result occurs.

SUMMARY OF THE INVENTION

The present invention is directed to a processing machine of an underfill process, suitable for identifying positions of chips in a more efficient and precise manner to improve processing yields.

As embodied and broadly described herein, a processing machine of an underfill process is provided. The processing machine comprises a carrier, an automated device, a scanning mechanism, an identifying device and a host. The carrier is suitable for carrying a package substrate provided with a plurality of chips bonded thereon. The automated device has a dispenser for filling an underfill between each of the chips and the package substrate. The scanning mechanism is configured on the carrier, and the identifying device is driven by the scanning mechanism to move along a predetermined path over the package substrate and identify positions of the chips before the dispenser fills the underfill between each of the chips and the package substrate. The identifying device is suitable for outputting an identifying result of chip position, and a movement of the identifying device is independent from a movement of the dispenser. The host is electrically connected to the automated device and the identifying device, wherein the host receives the identifying result and locates the dispenser of the automated device according to the identifying result when filling the underfill between each of the chips and the package substrate.

According to an embodiment, the processing machine further comprises a guiding rail, and the scanning mechanism is coupled to the guiding rail.

According to an embodiment, the identifying device of the processing machine is driven along a straight direction.

According to an embodiment, the identifying device of the processing machine comprises a camera.

The present invention is also directed to an underfill process suitable for a processing machine as mentioned above. The underfill process comprises the following steps: providing a package substrate with a plurality of chips bonded thereon; driving the scanning mechanism to move the identifying device along a predetermined path over the package substrate; identifying positions of the chips by the identifying device to output an identifying result of chip position; receiving the identifying result and locating the dispenser of the automated device according to the identifying result by the host; and, driving the automated device to fill the underfill between each of the chips and the package substrate by the dispenser.

According to an embodiment, the identifying device in the underfill process is driven along a straight direction.

According to an embodiment, the identifying device of the underfill process comprises a camera, and the step of identifying positions of the chips comprises capturing an image of the package substrate and the chips thereon by the camera.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
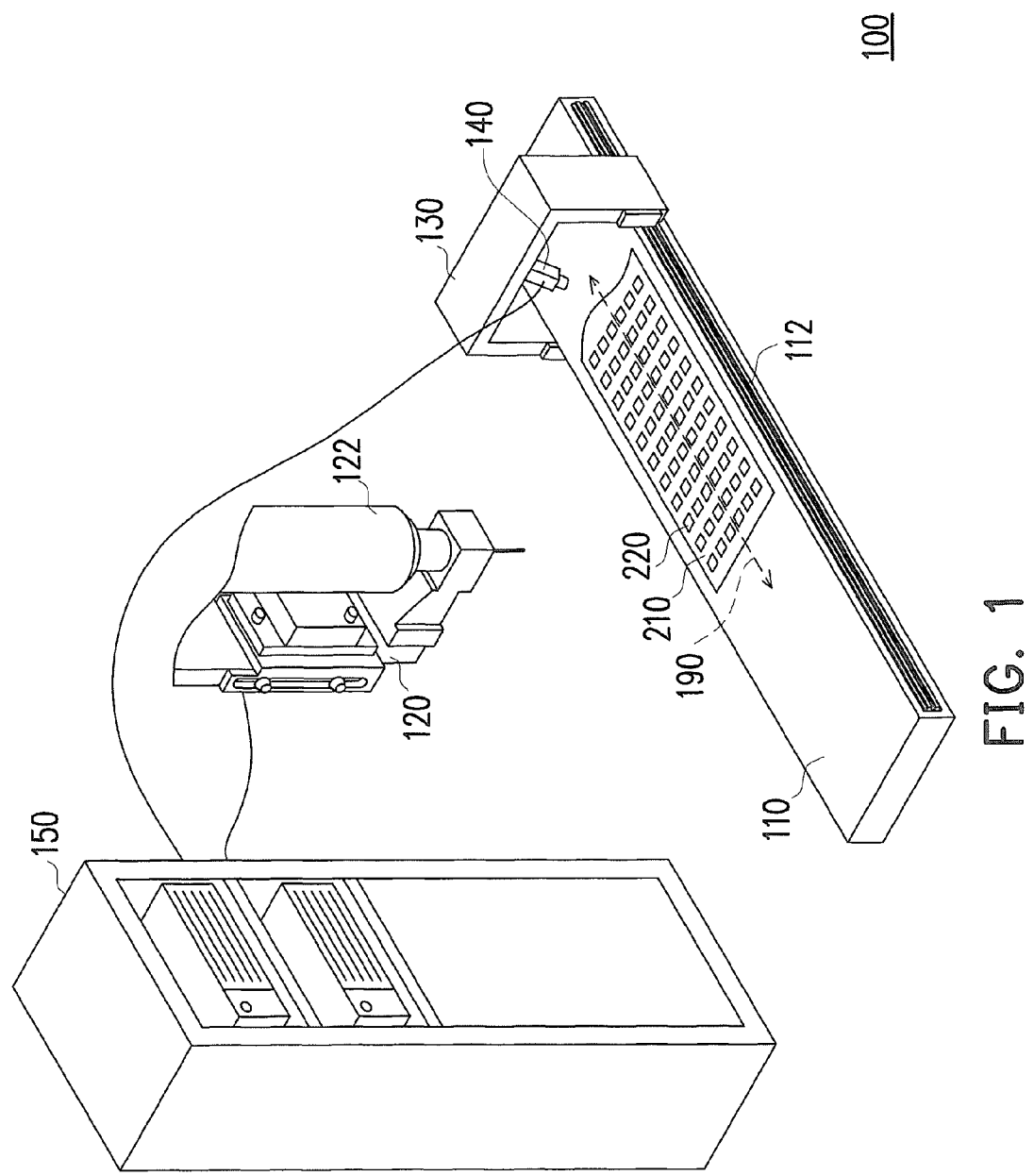
FIG. 1 illustrates a processing machine of underfill process according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
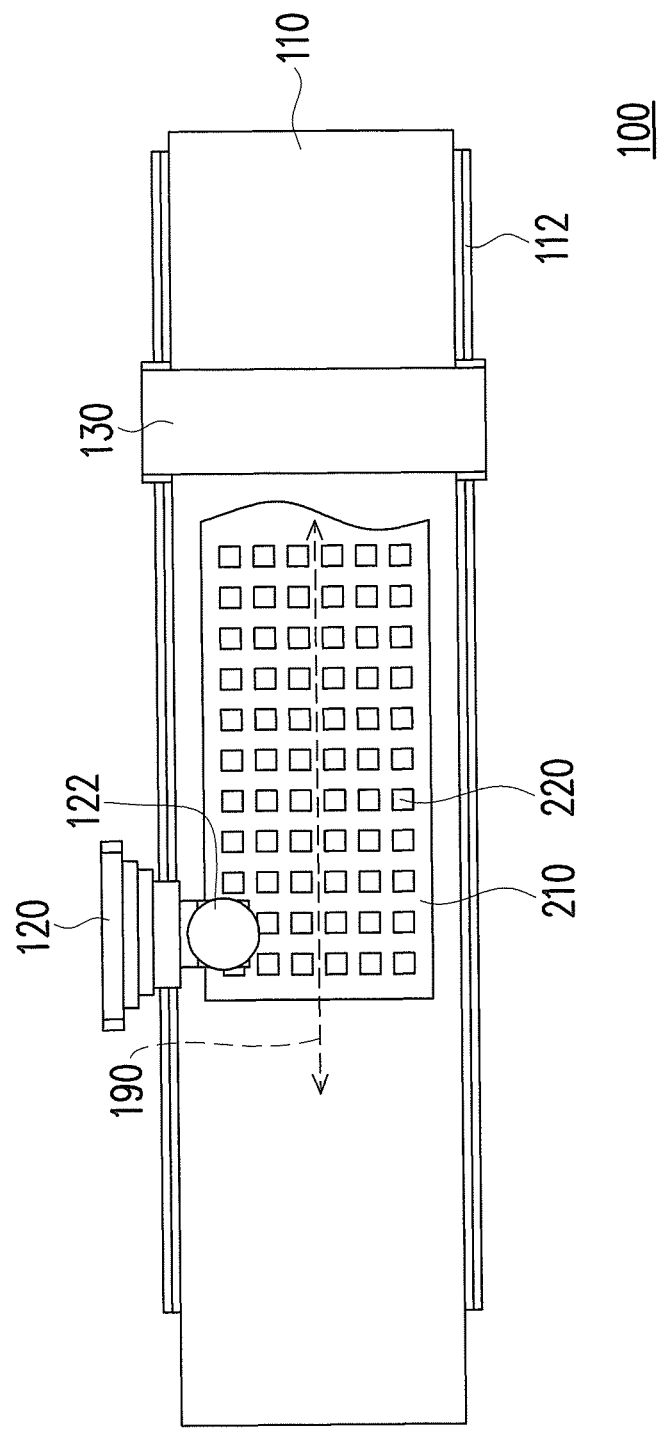
FIG. 2 is a top view of the processing machine of FIG. 1.

FIG. 1 illustrates a processing machine of underfill process according to an embodiment of the present invention. FIG. 2 is a top view of the processing machine of FIG. 1. As shown in FIG. 1 and FIG. 2, the processing machine 100 comprises a carrier 110, an automated device 120, a scanning mechanism 130, an identifying device 140 and a host 150. The carrier 110 is suitable for carrying a package substrate 210 provided with a plurality of chips 220 bonded thereon by for example flip-chip interconnect technology. Herein, the carrier 110 may comprise a conveyer for transmitting the package substrate 210. The automated device 120 is configured over the carrier 120 to perform package process on the package substrate 210. In the present embodiment, the automated device 120 has a dispenser 122 for filling an underfill between each of the chips 220 and the package substrate 210.

In addition, the scanning mechanism 130 is configured on the carrier 110, and the identifying device 140 is fixed to and moves along with the scanning mechanism 130. More specifically, a guiding rail 112 is configured on the carrier 110, and the scanning mechanism 130 is coupled to the guiding rail 112, so as to move the identifying device 140 along a predetermined path 190 over the package substrate 210, to identify positions of the chips 220 before the dispenser 122 fills the underfill between each of the chips 220 and the package substrate 210. The predetermined path 190 may be a straight path such that the identifying device 140 is driven along a straight direction. In the present embodiment, since the identifying device 140 and the dispenser 122 are driven by different mechanisms, i.e., the scanning mechanism 130 and the automated device 120, the movement of the identifying device 140 is independent from the movement of the dispenser 122. In other words, the position of the identifying device 140 is not affected by the movement of the dispenser 122 when performing the underfill process.

The host 150 is electrically connected to the automated device 120 and the identifying device 140. The identifying device 140 is for example a camera, so as to capture an image of the package substrate 210 and the chips 220 thereon. After that, the identifying device 140 output an identifying result of chip position to the host 150. The host 150 receives the identifying result from the identifying device 140 and outputs driving commands to the automated device 120, so as to locate the dispenser 122 according to the identifying result when filling the underfill between each of the chips 220 and the package substrate 210 by the dispenser 122.

Figure 3:
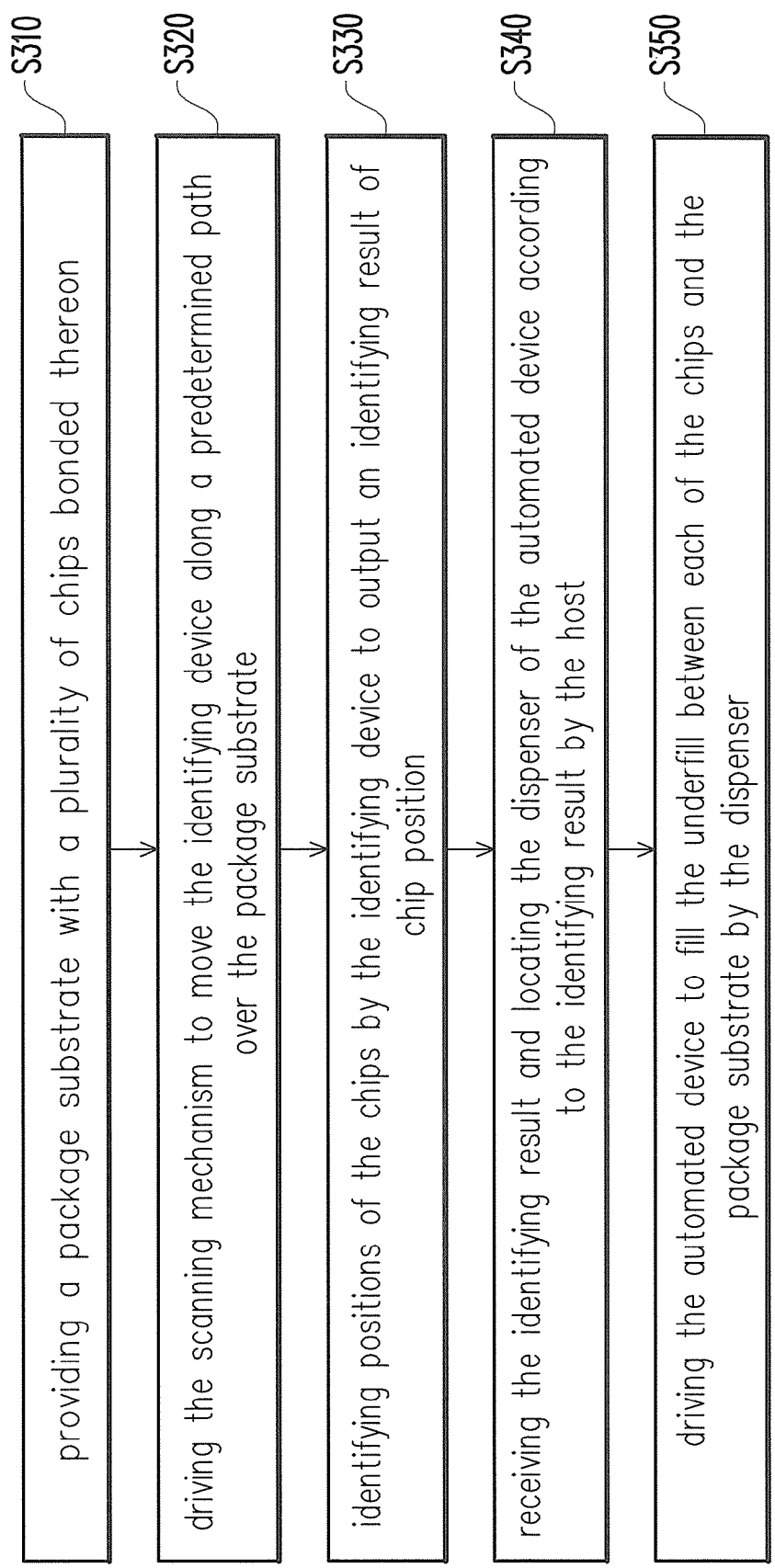
FIG. 3 shows an underfill process performed by using the processing machine of FIG. 1 and FIG. 2.

FIG. 3 shows an underfill process performed by using the processing machine 100 of FIG. 1 and FIG. 2. Referring to FIG. 1 through FIG. 3, the underfill process firstly provides the package substrate 210 with plural chips 220 bonded thereon (S310). Then, the scanning mechanism 130 is driven to move the identifying device 140 along the predetermined path 190 over the package substrate 210 (S320). The identifying device 140 then identifies positions of the chips 220 and output the identifying result of chip position (S330). Next, the host 150 receives the identifying result and locates the dispenser 122 of the automated device 120 according to the identifying result (S340). After that, the automated device 120 can be driven to fill the underfill between each of the chips 220 and the package substrate 210 by the dispenser 122 (S350).

In summary, the present invention provides a processing machine of an underfill process suitable for identifying positions of chips by an identifying device driven in independent from a dispenser before filling the underfill between each of chips and a package substrate. Therefore, the position of the chips can be identified in a batch, and the processing efficiency can be increased. Furthermore, since the identifying device is driven in independent from the dispenser, the position of the identifying device is steady and is not affected by the movement of the dispenser when performing the underfill process. Hence, the identifying results can be precise, to achieve a preferable dispensing.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A processing machine of an underfill process, the processing machine comprising:
    a carrier, for carrying a package substrate provided with a plurality of chips bonded thereon;
    an automated device, having a dispenser for filling an underfill between each of the chips and the package substrate;
    a scanning mechanism, configured on the carrier;
    an identifying device, fixed to and driven by the scanning mechanism to move along a predetermined path over the package substrate and identify positions of the chips before the dispenser fills the underfill between each of the chips and the package substrate, wherein the identifying device is suitable for outputting an identifying result of chip position, and a movement of the identifying device is independent from a movement of the dispenser; and
    a host, electrically connected to the automated device and the identifying device, the host receiving the identifying result and locating the dispenser of the automated device according to the identifying result when filling the underfill between each of the chips and the package substrate.

2. The processing machine according to claim 1, further comprising a guiding rail, the scanning mechanism being coupled to the guiding rail.

3. The processing machine according to claim 1, wherein the identifying device is driven along a straight direction.

4. The processing machine according to claim 1, wherein the identifying device comprises a camera.

5. A processing machine of an underfill process, the processing machine comprising:
    a carrier configured to carry a package substrate having a plurality of chips;
    a scanning mechanism disposed on the carrier;
    an identifying device disposed on the scanning mechanism;
    a dispenser configured to form an underfill on the package substrate;
    an automated device configured to carry and move the dispenser; and
    a host electrically coupled to the automated device and the identifying device and configured to individually control a movement of the automated device and the identifying device.

6. The processing machine of claim 5, wherein the carrier comprises a guiding rail configured to guide the scanning mechanism to move along a predetermined path.

7. The processing machine of claim 6, wherein the identifying device is fixed to and moves along with the scanning mechanism.

8. The processing machine of claim 5, wherein the identifying device is a camera configured to capture an image of the package substrate and the plurality of chips.

9. The processing machine of claim 5, wherein the identifying device is configured to identify a position of the plurality of chips on the package substrate.

10. The processing machine of claim 9, wherein the automated device is configured to move the dispenser according to the position of the plurality of chips on the package substrate.

11. The processing machine of claim 9, wherein the host is configured to control the movement of the automated device according to the position of the plurality of chips on the package substrate.

12. The processing machine of claim 5, wherein the identifying device is configured to move along a straight direction.

13. The processing machine of claim 5, wherein the carrier is a conveyer used to transmit the package substrate.

14. The processing machine of claim 5, wherein the identifying device is configured to capture an image of the package substrate and the plurality of chips and generate an identifying result according to a position of the plurality of chips on the package substrate.

15. The processing machine of claim 14, wherein the identifying device is configured to transmit the identifying result to the host.

16. The processing machine of claim 15, wherein the host is configured to receive the identifying result and control the movement of the automated device according to the identifying result.

17. The processing machine of claim 5, wherein the dispenser is configured to form the underfill between each of the plurality of chips and the package substrate.

\* \* \* \* \*